United States Patent [19]

Howard et al.

[11] 4,352,870
[45] Oct. 5, 1982

[54] HIGH RESOLUTION TWO-LAYER RESISTS

[75] Inventors: Richard E. Howard, Holmdel; Evelyn L. Hu, Somerset; Lawrence D. Jackel, Holmdel, all of N.J.

[73] Assignee: Bell Telephone Laboratories, Incorporated, Murray Hill, N.J.

[21] Appl. No.: 248,267

[22] Filed: Mar. 27, 1981

Related U.S. Application Data

[63] Continuation of Ser. No. 97,809, Nov. 27, 1979, abandoned.

[51] Int. Cl.³ .............................................. G03C 1/68
[52] U.S. Cl. .................................... 430/271; 430/273; 430/296
[58] Field of Search ............... 430/269, 270, 271, 273, 430/296, 502, 503

[56] References Cited

U.S. PATENT DOCUMENTS 3,668,029 6/1972 Blossick et al. ...................... 430/269
3,764,485 10/1973 Jacobos ................................ 430/502
3,873,313 3/1975 Horst et al. .......................... 430/269
3,955,981 5/1976 Stachniak ............................ 430/269

FOREIGN PATENT DOCUMENTS 1473194 5/1977 United Kingdom .
1514109 6/1978 United Kingdom .

OTHER PUBLICATIONS

Grobman et al., Electron Beam Lithography for 1 Micron Logic Circuit Fabrication Proceedings of the IEEE IEDN 1978, pp. 58–61.
Haller et al., Jour. of Electrochemical Society, 126, Jan. 1979, pp. 154–161.
Romankiw et al., IBM Technical Bulletin, vol. 18, No. 12, May 1976, pp. 4219–4221.

*Primary Examiner*—Jack P. Brammer
*Attorney, Agent, or Firm*—Bruce S. Schneider

[57] ABSTRACT

The use of a specific two-layer resist composition with a more sensitive and thicker resist as the lower layer allows the production of lines on the order of 400 A in width separated by spaces on the order of 400 A.

9 Claims, 4 Drawing Figures

$x \longrightarrow$

HIGH RESOLUTION TWO-LAYER RESISTS

This application is a continuation of application Ser. No. 97,809 filed Nov. 27, 1979 which is now abandoned.

BACKGROUND OF THE INVENTION

1. Field of the Invention

This invention relates to device processing and, more particularly, to device processing requiring the production of highly resolved features.

2. Art Background

The fabrication of devices such as semiconductor devices and magnetic bubble devices rely, to a large extent, on lithographic processes. In these lithographic processes a resist material is irradiated with exposing energy, for example, X-radiation, electrons, or light, in a desired pattern. This exposure induces a chemical reaction in the irradiated area of the resist material. The chemical reaction allows development, i.e., delineation of the pattern by changing the solubility of the exposed area relative to the unexposed area and thus allows removal of the exposed area for a positive resist or the unexposed area for a negative resist. Numerous resist materials have been developed. For example, polymethylmethacrylate (PMMA) has been used as a resist material and has yielded relatively good resolution, i.e., resolution as measured by line width in the range 10,000 Å to 1000 Å on thick substrates (thicker than 10μ). Although PMMA has relatively high resolution, its sensitivity is somewhat low for applications which require high throughput.

PMMA has been modified in a variety of ways to produce a concomitant modification of properties such as sensitivity. For example, the basic monomer of PMMA, i.e., methylmethacrylate has been copolymerized with methacrylic acid. Although this copolymer does not display the excellent resolution of PMMA, it nevertheless exhibits an increased sensitivity and thus has been suggested for applications such as delineating connection lines for LSI (large scale integrated circuits) where very high resolution is not essential and where relatively high sensitivity is more desirable.

The lower sensitivity of PMMA has also been exploited in resist configurations designed to produce high resolution. For example, the use of a bi-level resist composition which includes an upper level of the copolymer of methacrylic acid and methylmethacrylate and a lower level of PMMA has been discussed. (See Grobman et al., *Proceedings of IEEE* 1978 IEDM, page 58.) When this resist composition is irradiated with a dose sufficient to expose the upper polymeric layer, relatively little chemical change is induced in the lower PMMA layer. (This occurs due to the lower sensitivity of PMMA.) The upper layer is developed and after this development step a solvent is introduced to dissolve the uncovered PMMA.

Since progressively better resolution affords the possibility of both very large scale integration and discrete devices that depend on very fine features, research has been vigorous both in bi-level schemes to enhance resolution and in investigation of resist compositions which alone afford increased resolution. Generally, resolutions in the range 2500 Å to 20,000 Å for bi-level schemes and 1000 Å to 30,000 Å for single resist compositions are presently achievable on substrates thicker than 10 μm.

SUMMARY OF THE INVENTION

Very good resolution, i.e., resolution as good as 400 Å, is obtainable by utilizing a carefully chosen bi-level resist composition, i.e. a composition having a lower positive resist material between, and in intimate contact with, both a substrate and an upper positive resist material. The thickness of the lower resist material is chosen to reduce the number of backscattered electrons that impinge in a given area at the lower surface of the upper resist material. Additionally, the upper resist material should be thinner than the lower resist material, and the sensitivity of the lower resist material must be sufficiently high to compensate for this difference in thickness.

Exemplary of resist compositions within the subject invention is a bi-level composition including an upper level of PMMA and a lower level of a copolymer of methylmethacrylate and methacrylic acid (P(MMA/MAA)). For this exemplary composition lines as narrow as 400 Å are attainable.

DETAILED DESCRIPTION

Figure 1:
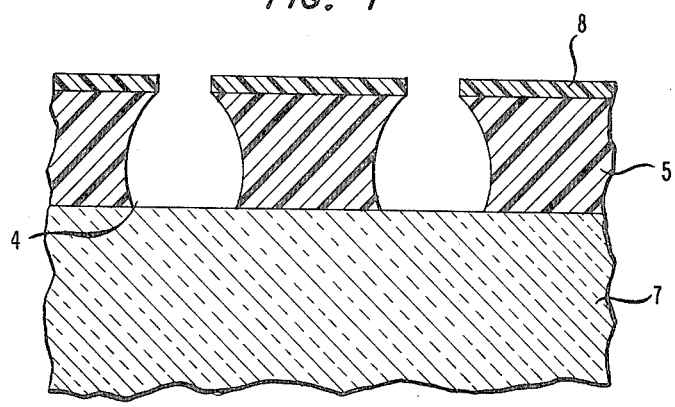
FIGS. 1 and 2 are illustrative of one aspect of the invention.

The use of the two-layer system of the subject invention provides resolutions greater than that achievable with a single layer of either of the component resist materials. The contemplated explanation for this phenomenon is that when the exposing radiation, e.g., electrons, hits the substrate upon which the resist material is deposited, secondary electrons are produced. The secondary and primary electrons that are backscattered impact the adjacent resist material and cause a chemical reaction to occur. Since this backscattering of electrons occurs over a $2\pi$ steradian solid angle, the exposed area of the lower resist material is greater than the area directly impacted by the incident radiation. By using a two-layer scheme, the backscattered electrons first impact the lower resist material. If this resist material is relatively thick, these electrons are diffused sufficient so that they do not cause a significant extent of chemical change in the upper resist material. That is, the thicker the lower resist material the fewer the number of backscattered electrons reaching a unit area of the upper resist material at the upper and lower resist material interface. The smaller the extent of this exposure due to backscattering, the less the degradation in resolution. Thus, the lower resist material must be sufficiently thick so that it does not preclude obtaining the desired resolution.

The dependence of resolution on the thickness of the lower resist material is determinable by using a controlled sample to discern the resolution achieved for a given composition and thickness of the lower resist. In a preferred embodiment, the thickness is chosen to be sufficiently thick so that the backscattered electrons do not limit the achieved resolution, i.e., the resolution is not improved with increased lower resist thicknesses. The number of backscattered electrons depends on the substrate composition and on the energy of the exposing radiation. Generally, for substrate materials such as silicon, and typical electron-beam energies in the range of 25 keV to 30 keV, the lower resist material should have a thickness of at least 1000 Å, preferably greater than 2000 Å, to satisfy this requirement.

If the thickness requirement described above is satisfied, the thickness and composition of the upper resist material, along with the processing parameters, determine the resolution obtainable. Generally the thicker the resist, the poorer the resolution. Exposure of a resist to radiation increases the solution rate of the exposed resist material in an appropriate developer. The greater the exposure dosage the greater the solution rate up to a point of saturation. The rate of change in solution rate with exposure is dependent on the composition of the material. When the resist is treated with a developer, the dissolution begins on the upper surface of the upper resist material. The development proceeds in all directions with the dissolution progressing in a given direction at a speed dependent on the degree of chemical change induced in that direction—the greater the chemical change, the greater the speed. The development speed is therefore greatest in the direction of the exposing radiation but is also significant in other directions due to exposure from scattered electrons. The thicker the material or the less the change in solution rate, the longer the development time necessary to produce the desired pattern through the thickness of the resist. The longer the development period, the greater the amount of dissolution in areas adjacent to this pattern and therefore the poorer the resolution.

The subject invention is advantageously directed to achieving resolution of 5000 Å or better. To attain such resolution, the upper resist material and the thickness of this material must be chosen so that the aperture in the upper surface of the resist material produced upon exposure and subsequent development is 5000 Å or less in regions of the pattern that require this fine delineation. Typically this is attained by using upper resist material thicknesses of less than 1 $\mu$m for materials such as PMMA. It is possible to measure the aperture width at the upper surface and the resulting resolution by electron microscopic inspection. For a given chosen material, the thickness necessary for a desired resolution is thus determined by using this measuring technique in conjunction with the use of a controlled sample.

The material employed as the lower layer depends upon the choice of material for the upper layer. As described above, the upper layer is chosen so that a given resolution is obtained. The upper resist material is exposed so that upon development, the entire thickness of the exposed area is removed within a time period adequate to prevent degradation of resolution. The lower resist material by necessity is exposed essentially to the same dose of incident radiation as is used to expose the upper resist material. (The number of electrons or other exposing units of energy reaching the upper resist material which do not reach the lower resist material is negligible compared to the total incident radiation.)

For the dose utilized, the lower resist material also must undergo sufficient reaction produced by the incident radiation and the electrons backscattered from the substrate so that upon development, its entire thickness in the exposed area is removed without significantly degrading the obtainable resolution. The satisfaction of this criterion depends on the thickness and sensitivity of the material. Generally to maintain the requirement of limiting the number of backscattered electrons reaching the upper resist material per unit area, and to maintain a resolution better than 5000 Å, ratios of lower resist to upper resist thickness in the range 50:1 to 1:1 are necessary.

Since the developer does not reach the lower resist material until it has dissolved through the thickness of the upper resist material the sensitivity of the lower resist material must be greater than that of the upper resist material to prevent degradation of the resolution. The upper layer continues to develop during the time necessary for adequate development of the lower layer. Although the areas of greater radiation impact (those areas corresponding to the desired pattern) are already removed, areas of lesser impact (those areas adjacent to the pattern) continue to be dissolved. If this additional development time is excessive, degradation in resolution is also significant. The basic criterion is that the sensitivity of the lower resist material must be sufficient so that the development period for the lower resist material does not prevent attainment of the desired resolution. Thus the sensitivity of the lower resist material must always be significantly greater than the sensitivity of the upper resist material. Generally this goal is achieved by utilizing a lower resist material that requires no more than one half, preferably no more than ¼ the development time (for a given incident exposure and a given developer) than is required for the upper layer.

In a preferred embodiment, electron-beams having an average electron energy in the range 25 keV to 30 keV and having a current density at the upper layer of the resist composition in the range 10 A/cm$^2$ to 0.3 A/cm$^2$, are utilized. (X-ray exposure is also possible.) The use of even more energetic electrons is, however, not precluded. Greater current densities are also not precluded if the coherency of the beam is maintainable. The cross-sectional dimension of the beam at the upper surface of the upper resist material should be maintained so that it is smaller than the smallest feature to be delineated. Excessive or insufficient doses lead to degraded resolution. Usually doses in the range 200 to 400 $\mu$C per cm$^2$ are utilized. Electron-beams suitable for use in conjunction with the subject invention are obtained, for example, by using conventional scanning electron microscope equipment.

Figure 2:
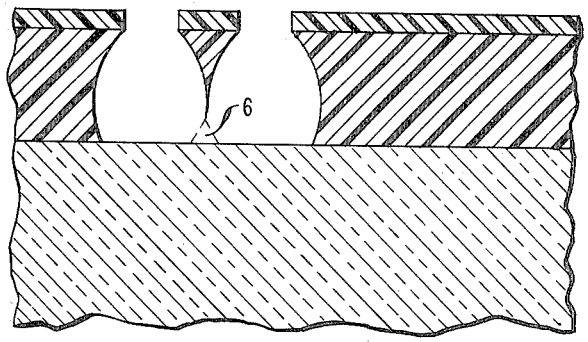

It should be noted that the structure obtained through exposure of the inventive resist composition is that shown in FIG. 1. The lower resist material, 5, because of its higher sensitivity, exhibits upon exposure and development an undercut region, 4. If the pattern features are closely spaced, it is possible that the two undercut regions in the lower resist material will overlap as shown in the cross-sectional view of FIG. 2 and the exposed area may collapse upon development. (The dotted lines indicated by 6 show the area where the two undercut regions overlap. If the pattern lines are too long for a given degree of overlap, the unsupported region of the resist collapses.) Generally, to prevent any overlap, the lower resist thickness should be less than two times the spacing between the features in the desired pattern. The occurrence of undercutting, leaving a suspended portion of upper resist with a limited length, is possible without collapse ensuing. Generally to prevent collapse, unsupported spans should have a length less than five times the width. If this is not attainable due to the other criteria previously discussed, the pattern spacing should be increased. As discussed, the sensitivity of the lower resist material should be sufficient not to limit resolution. If this sensitivity prevents delineation of a pattern with a desired distance between pattern lines the spacing must be increased. Typically, through use of the subject invention, patterns having dimensions of, for example, 1500 Å long and 500 Å apart or 5000 Å long and 1400 Å apart are obtainable.

Since undercutting is obtained through use of the subject resist compositions, oblique evaporation techniques (see Dolan, *Applied Physics Letters*, 31, 337 (1977)) are compatible with the use of the subject resist composition. For example, devices produced by oblique evaporation such as those described in E. L. Hu et al., *IEEE Transactions on Magnetics*, MAG 15, 585 (1979) are producible by using the subject resist composition. Additionally, conventional evaporation techniques using an evaporant flux normal to the substrate are compatible with the subject resist compositions.

The formation of the two-layer material is accomplished by conventional techniques. The lower layer, 5, in FIG. 1, is first deposited on the desired substrate, 7, by conventional techniques such as spinning. (See *Handbook of Thin Film Technology*, L. I. Maissel and R. Glang, McGraw Hill, 1970, page 7–31.) In a preferred embodiment, the upper resist material, 8, is then deposited on the lower resist material by conventional techniques such as spinning. It is desirable that the solvent used for spinning the upper resist material onto the lower resist material not solvate the lower resist material. For example, when PMMA is used as the upper resist material, and P(MMA/MAA) is used for the lower resist material, the solvents chlorobenzene and acetic acid are respectively utilized as spinning carriers for the upper and lower resist layers. The thickness of a spun layer is determined by the concentration of the spinning solution and by the rate of revolution during spinning. The necessary concentration of a given solution and the spin rate chosen to yield a given thickness varies with the materials utilized and is easily determined in each case by employing a controlled sample.

The following example is illustrative of the subject resists and a means for their utilization.

EXAMPLE

A silicon substrate measuring 1 inch × 0.5 inch × 0.020 inch having one polished side with a local smoothness finer than 100 Å was cleaned by immersing it in a hot water/detergent solution. The solution was ultrasonically agitated for approximately 30 minutes. The substrate was then removed from the detergent solution and sequentially rinsed in hot water followed by deionized water. The substrate was then scrubbed with a lint-free foam swab in deionized water. To remove the water, the substrate was treated in a vapor degreaser with isopropyl alcohol vapor. The substrate was then blown dry using dried nitrogen gas.

The silicon substrate was immersed in an adhesion promoter which is primarily hexamethyldisilazane for 3 minutes at 70 degrees C. The treated substrate was rinsed in xylene and again blown dry with dried nitrogen gas. The substrate was baked in an air atmosphere at 70 degrees C. Shipley AZ 1350J resist (a proprietary product of Shipley Corporation which is a cresolformaldehyde resin-based polymer composition) was spun onto the polished surface of the substrate at 6000 rpm for 30 seconds. A beaker was used to cover the spinning apparatus during this procedure to prevent the resist from drying too quickly. The resist was then baked at 70 degrees C. for 30 minutes.

Figure 3:
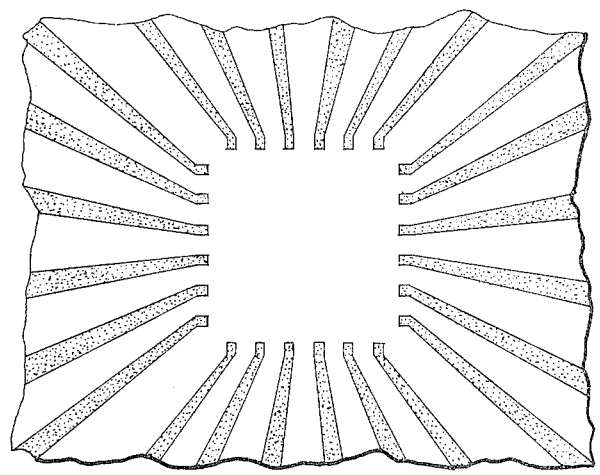
FIGS. 3 and 4 illustrate examples of patterns used in practicing the subject invention.

The resist was exposed with light from a mercury arc lamp in the pattern of the lead frame shown in FIG. 3. (The inner opening shown is a 45 μm square.) A standard optical mask was used to produce this pattern. The exposed resist was soaked in chlorobenzene for 5 minutes and blown dry. The resist was then developed in a one-to-one solution of AZ developer in water until the pattern appeared fully developed. (AZ developer is a proprietary product of Shipley Corporation and is basically an aqueous sodium hydroxide solution which contains a wetting agent.) The substrate with its developed resist pattern was placed in the substrate holder of a standard resistance-heated-boat evaporation apparatus and 1000 Å of Au was evaporated onto the substrate. The substrate was removed from the evaporation apparatus and soaked in acetone until the resist film lifted off. (The lead frame pattern thus formed on the silicon is used as a frame of reference for the subsequent use of the inventive resist materials.)

A solution of 2.4 grams of a copolymer of methylmethacrylate with methacrylic acid in 20 ml of acetic acid was prepared. The polymer used to produce this solution contained approximately 8.5 weight percent of methacrylic acid and had a relative viscosity of 9.5 when dissolved in a 10 percent by weight solution of ethylene glycol monoethyl ether. This solution was spun onto the surface of the silicon substrate which contained the lead frame. A spinning rate of 8000 rpm was utilized. As before, the beaker was employed to prevent the resist from drying too rapidly. The resulting lower resist layer was approximately 4000 Å thick. The sample was baked at 160 degrees C. for 30 minutes in an air atmosphere. A solution of one-to-one chlorobenzene and KTI Corporation electron-beam resist was prepared. The KTI resist is a 6 percent by weight solution of polymethylmethacrylate (average molecular weight of 950,000). This solution was spun onto the lower resist layer utilizing a spinning rate of approximately 8000 rpm. This procedure yielded an upper resist film thickness of about 1200 Å. The sample was then baked in air at a temperature of 160 degrees C. for 30 minutes.

To aid in focusing the exposing electron-beam, a sharp edge was provided by making a small scratch with a scribe through the resist into the Au film of the lead frame. The sample was mounted on a substrate holder for a scanning electron microscope (SEM) utilizing silver paste. The substrate holder was then mounted into the SEM. The electron-beam was focussed by using the detector of the SEM and by adjusting the beam so that the scratch previously produced was sharply defined. The electron-beam was set to have an accelerating voltage of 30 kV, a current of approximately 11.3 pA and a working distance, i.e., the distance between the focusing lens and substrate, of 15 mm. The use of these parameters yielded a current in the substrate of 10 pA. The beam was set so that an 11 μm square area was exposed. A transparency having the pattern shown in FIG. 4 was taped on a cathode ray tube (CRT). The transparency had dimensions of approximately 3 inches on a side. A photocell having an active area of approximately 1 cm$^2$ was positioned in a light tight box along with the CRT and about 6 inches from the CRT. The sweep of the electron-beam in the CRT was synchronized with the sweep of the electron beam in the SEM.

To align the pattern in the position desired a 10 KHz oscillator was used to control the electron-beam of the SEM. (This oscillator was used to chop the electron-beam so that it impacted the substrate 5 percent of the on time.) The beam was scanned using an X-direction frequency of 1 KHz and a y-direction frequency of 10 Hz. The electron beam of the SEM was completely blanked when the light from the CRT was occluded by the pattern on the transparency as detected by the photocell. Thus the pattern on the transparency appeared superimposed on the image of the substrate as imaged by the SEM. The substrate was positioned using the translational adjustments of the substrate holder so that the pattern appeared entirely within the boundaries of the open area of the lead frame. (It should be noted that this alignment procedure must be done relatively rapidly so that the resist material is not substantially exposed. Negligible exposure occurs if the alignment period under the conditions described is limited to 1 minute.)

Figure 4:
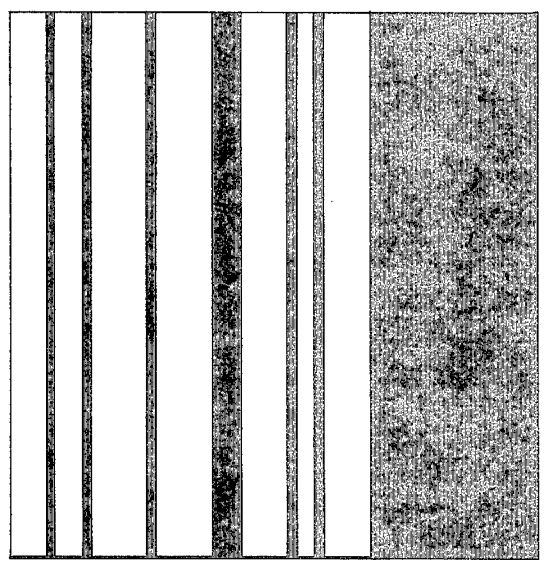

The x-sweep frequency and the y-sweep frequency were then set to 5 Hz and 0.077 Hz respectively. The oscillator was removed from the circuit so that the electron-beam was not chopped. The photodetector circuitry was adjusted so that when light was detected the electron-beam was blanked off so that electrons could not impact the substrate. The direction of the sweep was perpendicular to the opaque lines. (The x axis was as indicated in FIG. 4). The x and y sweep frequencies used and the writing field determined the line spacing. The pattern on the CRT was swept once while simultaneously exposing the resist. The exposed resist was removed from the SEM and developed for 5 seconds in a 1:2 solution of ethylene glycol monoethyl ether in methyl alcohol. The sample was then rinsed in deionized water and blown dry using dried nitrogen gas.

The substrate was then placed in a standard evaporation apparatus and Au was evaporated at normal incidence onto the substrate. The evaporation was continued until a Au layer having a 300 Å thickness was produced. The sample was removed from the evaporation apparatus and soaked in boiling acetone to remove the resist material. The resulting Au pattern had lines 5000 Å in length, 350 Å in width and separated edge-to-edge by 1350 Å.

We claim:

1. A resist element comprising an upper positive resist layer in intimate contact with a lower positive resist layer wherein said lower positive resist layer is in intimate contact with a substrate and wherein said upper and lower resist materials undergo a change upon impingement of exposing energy CHARACTERIZED IN THAT the sensitivity of said lower resist material is greater than the sensitivity of said upper resist material, said lower resist material requires less than one-half the development time as that required for an equal thickness of said upper resist material, and the thickness of said lower resist material is greater than the thickness of said upper resist material wherein said upper resist material and the thickness of said upper resist material are chosen to allow production of an aperture in the upper surface of 5000 Å or less whereby the sensitivities and thicknesses of said upper and lower layers yield a resolution better than 5000 Å upon using said exposing energy.

2. The resist element of claim 1 wherein the thickness of said lower resist layer is greater than 1000 Å.

3. The resist element of claim 1 wherein said upper resist layer is polymethylmethacrylate.

4. The resist element of either claim 1 or 3 wherein said lower resist layer is a copolymer of methacrylic acid and methylmethacrylate.

5. The resist element of claim 1 wherein the thickness of said lower resist layer is greater than 2000 Å.

6. A process for delineating a pattern in a resist element, said resist element comprising an upper positive resist layer in intimate contact with a lower positive resist layer, wherein said lower positive resist layer is in intimate contact with a substrate and comprising the steps of impacting said resist composition with a dose of exposing electron energy and removing the impacted regions of said upper and said lower resist material CHARACTERIZED IN THAT the sensitivity of said lower resist material is greater than the sensitivity of said upper resist material, said lower resist material requires less than one-half the development time as that required for an equal thickness of said upper resist material, and the thickness of said lower resist material is greater than the thickness of said upper resist material wherein upon said exposure and said removal an aperture of 5000 Å or less is produced as a portion of said pattern in said upper resist material whereby the sensitivities and thicknesses of said upper and lower layers yield a resolution better than 5000 Å upon using said exposing energy.

7. The resist process of claim 6 wherein the thickness of said lower resist layer is greater than 1000 Å.

8. The resist process of claim 6 wherein said upper resist layer is polymethylmethacrylate.

9. The resist process of either claim 6 or 8 wherein said lower resist layer is a copolymer of methyl methacrylate and methacrylic acid.

* * * * *